(12) United States Patent
Bustos et al.

(10) Patent No.: US 7,041,585 B2
(45) Date of Patent: May 9, 2006

(54) PROCESS FOR PRODUCING AN INTEGRATED ELECTRONIC COMPONENT

(75) Inventors: Jessy Bustos, Le Touvet (FR); Philippe Coronel, Barraux (FR); Christophe Regnier, Saint Hilaire du Touvet (FR); François Wacquant, Saint Ismier (FR); Brice Tavel, Grenoble (FR); Thomas Skotnicki, Crolles (FR)

(73) Assignee: STMicroelectronics S.A., (FR)

( * ) Notice: Subject to any disclaimer, the term of this patent is extended or adjusted under 35 U.S.C. 154(b) by 61 days.

(21) Appl. No.: 10/638,228

(22) Filed: Aug. 7, 2003

(65) Prior Publication Data

US 2004/0126977 A1   Jul. 1, 2004

(30) Foreign Application Priority Data

Sep. 6, 2002   (FR) .................................. 02 11054
Mar. 6, 2003   (FR) .................................. 03 02772

(51) Int. Cl.
 *H01L 21/3205*   (2006.01)
(52) U.S. Cl. ...................................... 438/592; 257/412
(58) Field of Classification Search ................ 257/388, 257/412; 438/592
See application file for complete search history.

(56) References Cited

U.S. PATENT DOCUMENTS

| | | | |
|---|---|---|---|
| 5,658,816 A | 8/1997 | Rajeevakumar | |
| 5,943,581 A * | 8/1999 | Lu et al. | 438/386 |
| 5,976,970 A * | 11/1999 | Dalal et al. | 438/637 |
| 6,127,712 A | 10/2000 | Wu | |
| 6,130,482 A | 10/2000 | Iio et al. | |
| 6,303,447 B1 * | 10/2001 | Chhagan et al. | 438/299 |
| 6,319,806 B1 * | 11/2001 | Kim | 438/592 |
| 6,376,888 B1 | 4/2002 | Tsunashima et al. | |
| 6,599,805 B1 * | 7/2003 | Trivedi | 438/305 |
| 6,645,818 B1 * | 11/2003 | Sing et al. | 438/275 |

(Continued)

FOREIGN PATENT DOCUMENTS

EP   0 890 998   1/1999

(Continued)

OTHER PUBLICATIONS

Matsuo, et al., "Damascene Metal Gate MOSFETs with Co Silicided Source/Drain and High-k Gate Dielectrics", 2000 Sumposium on VLSI Technology; Digest of Technical Papers; Honolulu, Jun. 13-15; 2000 Symposium on VLSI Technology, New York, NY, IEEE, US, pp. 70-71, XP000970766.

(Continued)

*Primary Examiner*—Christian D. Wilson
(74) *Attorney, Agent, or Firm*—Jenkens & Gilchrist, PC

(57) ABSTRACT

A process for producing an electronic component includes covering a substrate with a portion defining, with the substrate, a volume at least partly filled with a temporary material. The temporary material is then removed via chimney for access to said volume. A deposition of a fill material is then made in said volume, the fill material being obtained from precursors supplied via the chimney. The process is particularly suitable for producing a gate of an MOS-type transistor. In this case, the fill material is conducting or semiconducting, and an electrically insulating coating material may also be deposited in said volume before the (semi) conducting fill material. The process also includes defining a trench in a substrate filled with a temporary material. The filled trench is then covered with a circuit portion. The temporary material is then removed via a chimney for access to the trench. A deposition of low dielectric fill material is then made in the trench.

56 Claims, 5 Drawing Sheets

U.S. PATENT DOCUMENTS

2001/0038136 A1  11/2001  Abiko
2002/0025638 A1   2/2002  Yeh et al.
2003/0151098 A1*  8/2003  Nishida et al. ............. 257/369

FOREIGN PATENT DOCUMENTS

| JP | 63053977 | 3/1988 |
| WO | WO 00/77828 | 12/2000 |
| WO | WO 01/80286 | 10/2001 |

OTHER PUBLICATIONS

French Search Report, FA 622862/FR 0211054, dated Apr. 2, 2003.

French Search Report, FA 633952/FR 0302772, dated Oct. 17, 2003.

* cited by examiner

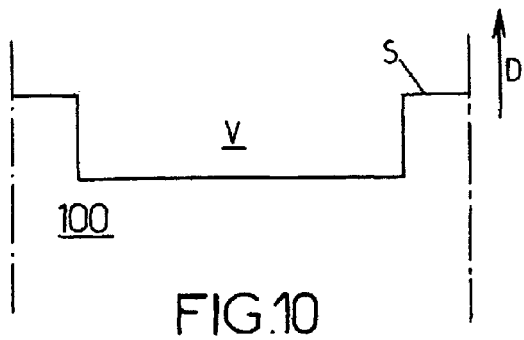
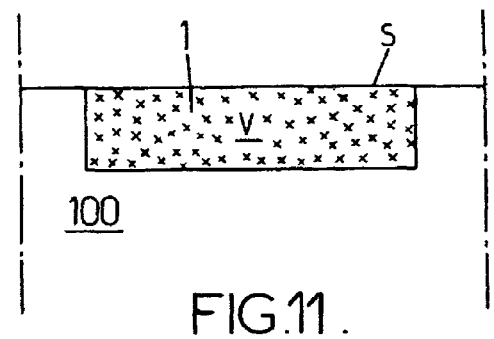
FIG.10  FIG.11.
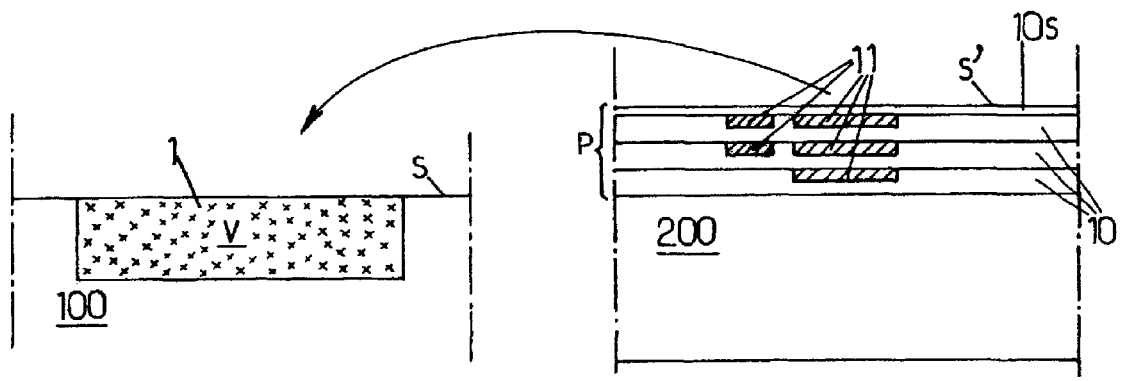
FIG.12.
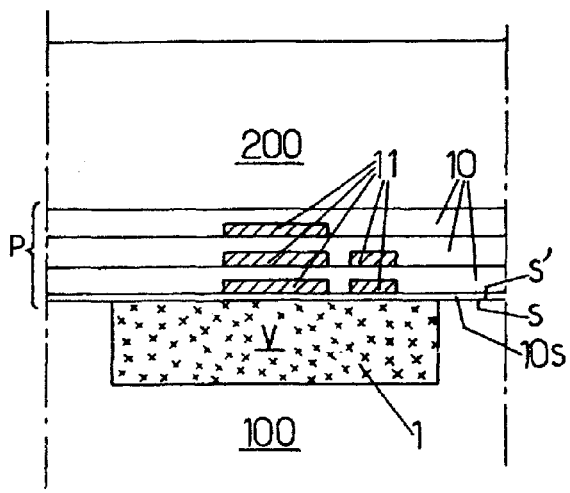
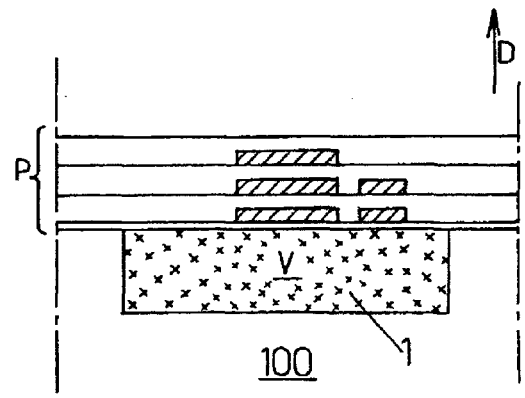
FIG.13.  FIG.14.

PROCESS FOR PRODUCING AN INTEGRATED ELECTRONIC COMPONENT

PRIORITY CLAIM

The present application claims priority from French Application for Patent No. 02 11054, filed Sep. 6, 2002, and No. 03 02772, filed Mar. 6, 2003, the disclosures of which are hereby incorporated by reference.

BACKGROUND OF THE INVENTION

1. Technical Field of the Invention

The present invention relates to a process for fabricating an integrated electronic component and, in particular, to the process for fabricating such a component comprising a limited volume of a specified material, the dimensions of which have to be precisely defined and reproduced identically during mass production.

2. Description of Related Art

Increasing the level of integration of electronic circuits leads to a reduction in the geometrical dimensions of the components that make up these circuits. To take an example, the technology for fabricating field-effect transistors or MOS (Metal Oxide Semiconductor) transistors is designated by the width of the gate of these transistors, this being measured along the direction of flow of the electrical current between the source and the drain of the transistors. Thus, 0.13 and 0.10 micron technologies for fabricating semiconductor components correspond to transistors whose gates have respective widths of 130 and 100 nanometers.

To fabricate components having such levels of integration reproducibly, it is necessary for the processes used to allow for very precise control over the geometrical dimensions of those parts of the components that determine the electrical characteristics finally obtained. This is in particular the case for the gates of MOS transistors.

One method of forming a material of a specified external shape on a substrate consists of depositing, in a first step, a substantially uniform layer of this material on the substrate and then, in a second step, removing this material by etching beyond a part of the substrate defined by a mask. The etching process must be chosen so that said material in its definitive form has sidewalls conforming to the desired geometry, these possibly being, for example, planar sidewalls perpendicular to the surface of the substrate.

However, when said material is in particular a metal, such sidewalls formed by etching a layer deposited beforehand are imperfect on the scale of the levels of integration currently desired. In particular, they are inclined with respect to a direction perpendicular to the surface of the substrate, or even exhibit undulations in this direction.

Moreover, the etching process used must be selective between the material deposited on the substrate and the material of the substrate itself, so as to remove the material deposited beyond the final desired feature, without removing material from the substrate. Without such selectivity, the surface of the substrate is modified during etching, preventing precise control of the height, relative to the surface of the substrate, of the deposited material remaining after the etching step. This selectivity represents a constraint on the choice of materials for the component, which may be incompatible with some of the desired characteristics of said component.

The Damascene process known to those skilled in the art, or its variant "dual Damascene", constitutes a second method of forming a feature of specified shape on a substrate. This process consists of depositing a layer of an external material on the substrate, in which layer a cavity is formed that will serve as a mold for the material on which a specified shape has to be conferred. The cavity is filled with this latter material, forming an excess above the cavity, so as to guarantee that the cavity is completely filled. The excess fill material is then removed by polishing.

A drawback with the Damascene and dual-Damascene processes stems from the final polishing. This is because the polishing rate depends on the material removed, that is to say the external material or fill material, so that regions having a high feature density are eroded during polishing at a rate different from that of regions having a lower feature density. This results in a loss of planarity of the polishing surface, creating disparities within a series of components fabricated using the processes of this type. Such a loss of planarity after polishing may correspond to variations in the thickness of the layer of external material of up to 150 nanometers, incompatible with 0.10 to 0.13 micron technologies that require this thickness to be controlled to within about 10 nanometers. This planarity requirement will become even more demanding in the case of future integrated circuit fabrication technologies.

For some geometrical configurations, these thickness variations may also cause, during polishing, insufficient removal of the excess fill material. When the fill material is conducting, residual parts of this excess may subsequently cause an electrical short circuit during use of the electrical device incorporating such a component.

There is accordingly a need to produce features of defined materials on a substrate allowing precise control of the geometrical dimensions of said features.

SUMMARY OF THE INVENTION

The present invention provides a process for producing an electronic component, comprising:

a) covering a substantially planar surface (S) of a substrate with a portion defining with the substrate a volume at least partly filled with a temporary material;

b) removing the temporary material from said volume via a chimney that extends between said volume and an access surface; and c) introducing a fill material into said volume, obtained from first precursors supplied via the chimney.

According to the invention, the volume into which the fill material is introduced is separated from the access surface so that the dimensions of said volume that were fixed initially are definitively preserved right to the end of the process for producing the electronic component.

One advantage of the process of the invention is that of suppressing the constraints relating to the choice of fill material, these constraints being associated with the techniques for removing the fill material selectively with respect to the substrate material and/or the materials defining said volume. This is because the process of the invention does not include removing the fill material from said volume. In addition, according to the process, the fill material is formed after the temporary material has been removed, so that removing the temporary material does not limit the choice of fill material.

Another advantage of the process of the invention lies in the absence of chemical contamination, and of solid particles, generated during a), b) and c). The process is then compatible with a high level of purity of the materials of the electronic component, especially the fill material, needed to obtain particularly demanding electrical characteristics.

Yet another advantage of the process of the invention is that it allows the substrate and the materials present on the substrate to be heated before c) of the process. Thus, the use of a fill material liable to be degraded by a heat treatment is compatible with heating of at least some of the other materials of the electronic component, in order to confer specified properties thereon.

In one particular geometrical configuration to which the invention applies, the chimney has a section parallel to the surface of the substrate which is substantially smaller than a projection of said volume onto the surface of the substrate. The process of the invention therefore allows the fill material to be introduced into said volume via a smaller opening, particularly compatible with the production of electronic components having a high level of integration.

In one geometrical configuration in which the chimney is approximately perpendicular to the surface of the substrate, the chimney furthermore allows access to a buried part of the electronic component being produced, that is to say a part not adjacent to said access surface. The process of the invention is therefore particularly suitable for producing structures having several superposed layers, contributing to a reduction in the cost of the electronic component, by reducing the size of the substrate.

Said volume may be placed, in particular, just below the surface of the substrate or just above this surface. In the former case, the process may include the following operations performed before a):

removing part of a material of the substrate corresponding to said volume; and at least partly filling said volume with the temporary material.

In the case in which said volume lies above the surface of the substrate, the process may include the formation, before a), of a feature on the surface of the substrate that includes said volume at least partly filled with the temporary material.

Several different methods can be used to cover the surface of the substrate with said portion.

A first method includes forming said portion on another substrate, called a temporary support, by successively depositing suitable materials on this temporary support. Said portion initially carried by the temporary support is then transferred onto the surface of the substrate intended to bear the electronic component, using one of the transfer processes known to those skilled in the art, such as, for example, the process called wafer bonding. The temporary support is then removed, for example by polishing, starting from a surface of the temporary support opposite said portion. This removal may optionally be supplemented by plasma etching (or dry etching).

According to a second method, at least part of said portion comprises materials formed directly on the surface of the substrate intended to carry the electronic component.

The chimney for access to said volume is then formed in said portion by removing at least one material external to said volume, between the access surface and said volume.

The temporary material is then removed from said volume via the chimney using a removal process known to those skilled in the art, such as, for example, isotropic etching of the temporary material. Such isotropic etching may be carried out by means of a plasma (dry etching) that penetrates via the chimney as far as the temporary material in said volume, or by introducing via the chimney a liquid solution incorporating specified chemical reactants (chemical etching). In the case of etching using a liquid solution, electrochemical etching may in particular be carried out by applying an electrical voltage between the temporary material and an electrode immersed in the solution.

The components of the plasma or the chemical reactants of the solution used may be suitably chosen so that the temporary material is selectively, or at the very least principally, removed relative to the other materials of said portion, but are external to said volume. To do this, the temporary material may be chosen from the following materials: silicon, a silicon-germanium alloy, silica and silicon nitride, for which materials suitably selected processes of removal selected with respect to materials external to said volume are known to those skilled in the art.

Said volume occupied by the temporary material may also be bounded, over at least part of its boundary, by at least one specific material resistant to the removal of the temporary material. This specific material therefore constitutes an isotropic etching stop barrier between the temporary material and a material of said portion external to said volume.

A first material resistant to the removal of the temporary material may especially be deposited initially in the form of a stop layer between the temporary material and the substrate. Such a configuration makes it possible to use, in particular, the same material for the substrate and for the temporary material, such as, for example, silicon. Optionally, said first material of the stop layer may be removed between the steps of removing the temporary material and of introducing the fill material. Said volume therefore corresponds to the joining of the space initially occupied by the temporary material and of the space occupied by the stop layer.

During c) of the process of the invention, the fill material may be formed simultaneously in said volume and in the chimney. For some applications of the process of the invention, complete filling of said volume with the fill material may be unnecessary. In particular, it may be sufficient to deposit the fill material on the internal walls of said volume, leaving a central part of said volume empty.

According to one particular way of implementing the invention, a coating material is introduced into said volume before the fill material, obtained from second precursors supplied via the chimney. Such a coating material may have various functions within a final electronic component or during its production. Such functions are, for example, to improve the adhesion of the fill material to the material of the walls of said volume, to promote growth of the fill material during c) of the process, or else to provide chemical or electrical insulation between the substrate and the fill material.

The process of the invention is particularly by suitable for the production of field-effect transistor gates. In this case, an electrically conducting fill material and an electrically insulating coating material may be used to form the gate and the gate insulation oxide of the transistors. When the chimney is also at least partly filled with the conducting fill material, it may constitute an electrical connection connecting the gate of the final transistor.

The invention also relates to an electronic component produced according to a process as described above. It also relates to an electrical device comprising such components. Said components may in particular be a field-transistor whose gate is produced using the process of the invention.

BRIEF DESCRIPTION OF THE DRAWINGS

A more complete understanding of the method and apparatus of the present invention may be acquired by reference to the following Detailed Description when taken in conjunction with the accompanying Drawings wherein:

FIGS. 10 to 17 illustrate various steps in the production of an array of tracks for the rapid transmission of electrical signals using a process according to the invention.

DETAILED DESCRIPTION OF THE DRAWINGS

In the FIGURES, for the sake of clarity the dimensions of the various parts of components shown are not in proportion with their actual dimensions. All these FIGURES are sectional views of at least one substrate and of various materials deposited on a planar surface of this substrate. The sectional views are considered in planes perpendicular to the surface of the substrate. In these FIGURES, identical references correspond to similar elements. A direction perpendicular to the surface of the substrate, oriented upwards in the FIGURES, is denoted by D, the substrate being placed in the lower part of the FIGURES. The terms "above", "below", "on", "under", "upper" and "lower" used in the following will refer to this orientation.

The process of the invention will now be described in detail within the context of the production of a field-effect transistor or a MOS transistor, the gate of which is made of a metallic material. Such a metallic gate confers to the MOS transistor dynamic characteristics superior to those of an equivalent MOS transistor whose gate is made of conducting polycrystalline silicon, and allows a particular reduction in the size of this type of transistor.

Figure 1:
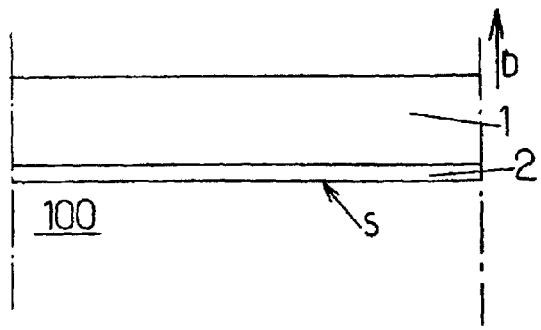
FIGS. 1 to 9 illustrate various steps in the production of a field-effect transistor using a process according to the invention.

In FIG. 1, a planar surface portion S of a substrate 100, for example made of single-crystal silicon, is covered with a layer 2 of a first material. The layer 2 is itself covered with a layer of temporary material 1. The layers of the temporary material 1 and of the first material 2 are substantially uniform over the surface portion S, with respective thicknesses of 150 nanometers and 10 nanometers for example, along the direction D. Said first material of the layer 2 is chosen in order to resist a process to remove the temporary material of the layer 1. As an example, the temporary material is silicon and said first material is silica $SiO_2$.

A masking material 5, for example, made of silicon nitride $Si_3N_4$, is then deposited on the layer of temporary material 1, with a thickness possibly of about 10 nanometers. Alternatively, silica $SiO_2$ may also constitute the masking material 5.

Figure 2:
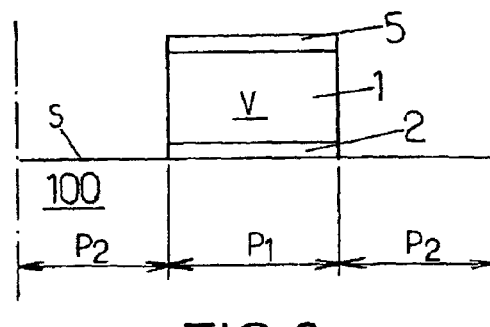

The masking material 5 and the temporary material 1 are then removed away from a region P2 of the substrate 100 (FIG. 2). This removal is carried out using one of the methods known to those skilled in the art, for example using a lithographically produced mask of a resist covering the material 5 in the region P1 and then exposing the substrate to at least one suitable etching plasma, that depends on the material 5 and then on the material 1, during removal. This removal defines the volume V corresponding to the joining of the space occupied by the temporary material 1 remaining in the region P1 after this etching and of the space occupied by that part of the material 2 lying between the remaining temporary material 1 and the substrate 100. The residual temporary material 1 may be termed a "false gate", given that its role is to locate the position of the definitive gate of the transistor during part of the transistor fabrication process. The dimensions of this false gate parallel to the surface S are, for example, 15 to 130 nanometers in the plane of FIG. 2 and 120 to 200 nanometers in the direction perpendicular to the plane of FIG. 2.

Next, the material 2 is removed from the surface S in second regions P2 of the substrate away from the first region P1. In particular, the regions P2 may extend on either side of the region P1, being adjacent thereto (FIG. 2). This removal of the material 2, if it is made of silica, may be carried out by isotropic chemical etching, especially of the flash type. Such etching uses a solution containing hydrofluoric acid HF, optionally moderated by ammonium fluoride $NH_4F$.

Figure 3:
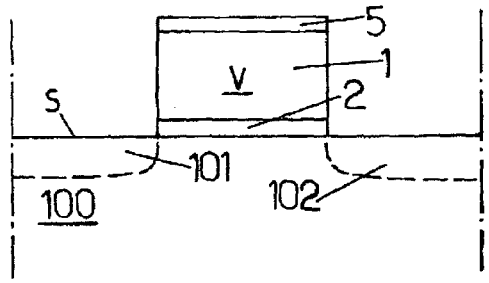

A first doping implantation operation is then carried out in two portions 101 and 102 of the substrate 100 (FIG. 3), these being called extensions, that extend on either side of the region P1. This first, shallow implantation below the surface S, within the substrate 100 is carried out in a manner known to those skilled in the art, especially by being limited transversely by the opposed ends of the false gate 1. Such an implantation process is said to be self-aligned with respect to the position of the gate.

Figure 4:
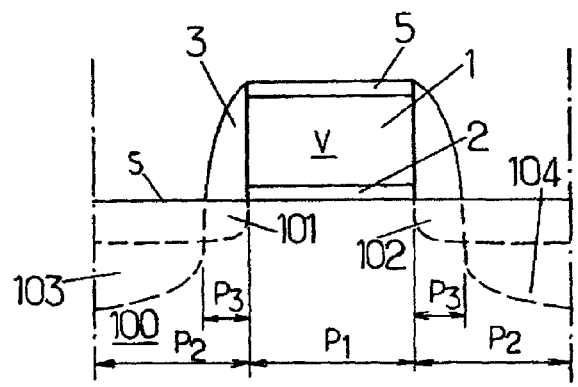

Next, in a manner known to those skilled in the art, a second material 3 resistant to the removal of the temporary material 1 is deposited in a third region P3 of the surface S surrounding the region P1 (FIG. 4). The second resistant material 3 is, for example, silicon nitride $Si_3N_4$ initially deposited in the form of a continuous layer covering the entire surface S, and then etched isotropically along the direction D. The second resistant material 3 thus surrounds the false gate 1, parallel to the surface S, up to the height, along the direction D, of the upper surface of the masking material 5. It constitutes the spacer of the final transistor, placed between the gate and the source of this transistor on the one hand, and between the gate and the drain of this transistor on the other.

A second doping implantation, of the same type as the first implantation, is then carried out in two portions 103 and 104 of the substrate 100 (FIG. 4) corresponding to the source and drain regions of the final transistor. These portions 103 and 104 extend respectively from in line with each external end of the spacer 3, on each side of the spacer 3, and extend into the substrate 100 to a greater depth below the surface S than the maximum depth of the extensions 101 and 102.

Figure 5:
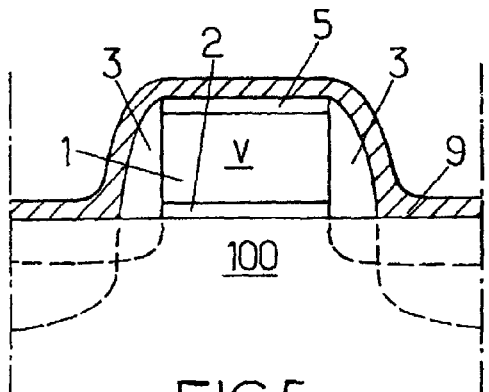

The surface S is then covered with an approximately uniform continuous layer 9 of a metal (FIG. 5). The metal used is chosen to form, when it is heated, a conducting alloy with the silicon material on which it is deposited. As is usual, cobalt is used and this forms the alloy $CoSi_2$. Alternatively, other metals may be used as long as they form a similar conducting alloy with silicon. The metal-silicon alloy, or metal silicide, forms in the regions where the metal 9 is in direct contact with the silicon material of the substrate 100, that it is to say in the regions P2 away from the regions P3. The spacer 3 and the masking material 5 prevent the formation of a silicide from the silicon material of the false gate 1. After heating to form the silicide, the residual metal 9, away from the parts of the metal 9 that have formed the silicide, is removed by dissolving it in an acid chemical solution or by etching by means of a plasma accelerated against the surface S with a moderate electrical voltage. The remaining regions 9a of metal silicide form the electrical contact regions of the source and of the drain of the final transistor.

Figure 6:
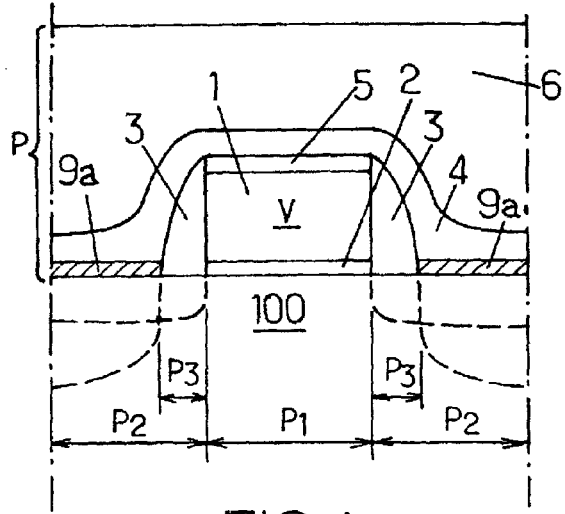

Next, a first external material 4 is deposited continuously and approximately uniformly in the regions P1 and P3, and in a fourth region of the substrate that surrounds the region P3. In FIG. 6, the material 4 is deposited in the form of a layer covering all of the surface portions S, including the spacer 3 and the masking layer 5 above the volume V. Said fourth region then corresponds to the region complementary to the regions P1 and P3 in relation to the entire surface portion S. In particular, the material 4 may be silicon nitride $Si_3N_4$. The process for depositing the material 4 may, for example, be a process similar to that used for the masking material 5. The thickness of the material 4 along the direction D is, for example, between 30 and 40 nanometers.

Next, the surface portion S is covered with a layer of a second external material 6 up to, for example, a height of between 500 and 800 nanometers above the surface S of the substrate 100. In particular, this second external material may be chosen so as to be rapidly deposited. For example, this may be silica $SiO_2$ obtained by plasma-enhanced chemical vapor deposition (PECVD). The upper surface of the material 6 is then polished so as to form a surface approximately parallel to the surface S of the substrate 100.

In this first way of implementing the process of the invention, the materials 3–6 constitute said portion, obtained by the process of the invention, labelled P in FIG. 6, which covers the surface S of the substrate 100.

In a known manner, the semiconducting properties of the implanted substrate portions 101–104 are definitively obtained only after a specific heating at high temperature, for example at about 1000° C., called "activation annealing". This heating impairs none of the materials borne by the substrate 100 at this point in the execution of the process, these materials being polysilicon in the case of the temporary material 1, silica $SiO_2$ in the case of said first material 2 resistant to the removal of the temporary material and in the case of the second external material 6, silicon nitride $Si_3N_4$ in the case of the second material 3 resistant to the removal of the temporary material, in the case of the first external material 4 and in the case of the masking material 5, and the metal silicide 9a which exhibits refractory thermal behavior. Thus, by virtue of the process of the invention, a definitive metallic gate may be combined with the high-temperature activation annealing, especially at a temperature above the melting point of the metal of the gate, the metal gate being formed after the activation annealing.

Figure 7:
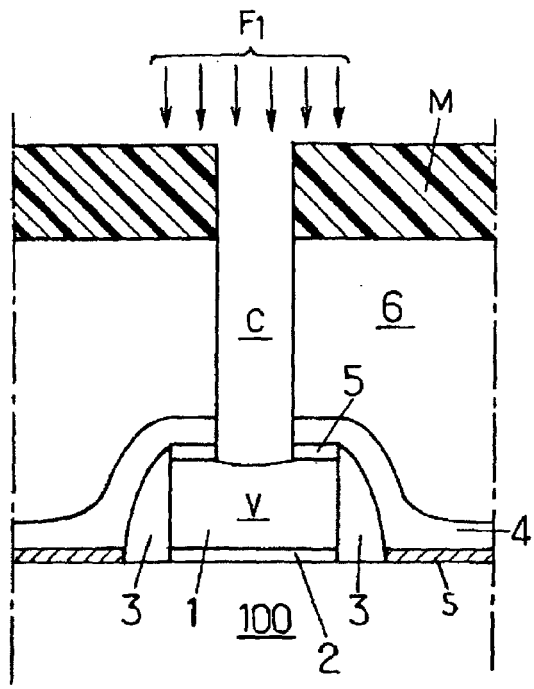

A chimney C is then made between the upper surface of the second external material 6 and the volume V (FIG. 7). To do this, using a lithographic process known to those skilled in the art, a resist etching mask M having an opening intended to define the cross section of the chimney C parallel to the surface S is deposited on the material 6. The substrate 100 bearing the mask M is then exposed to a directional etching plasma. In such an etching process, a parallel flux of accelerated particles F1 is sent towards the substrate 100, removing the successive materials appearing beneath the opening of the mask M. This removal is carried out as an advancing front perpendicular to the direction of the flux F1 and moving parallel to the direction of the flux F1. The flux F1 is parallel to the direction D. Molecules of fluorine compounds such as $C_4F_8$ are introduced into the directional etching plasma in order to increase, by chemical effect, the rate of etching, in particular of the second external material 6. The second external material 6 is thus removed as a column parallel to the direction D, then the first external material 4 and the masking material 5. The chimney C is thus formed.

Figure 8:
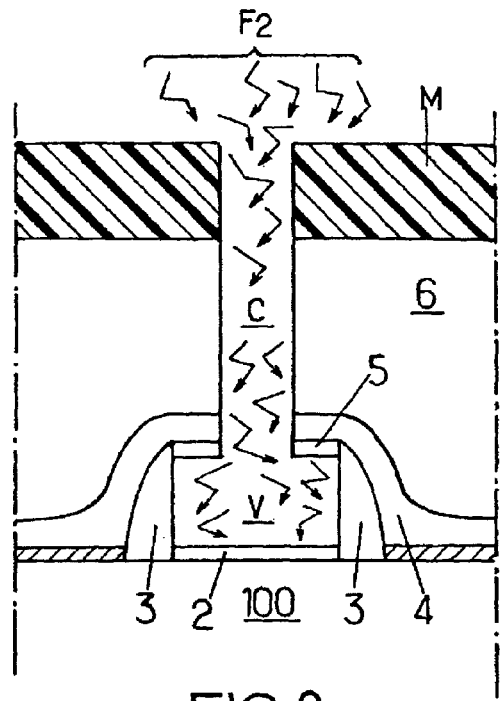

The substrate 100 still covered with the etching mask M is then exposed to a plasma for isotropically etching the material 1 of the false gate (FIG. 8). Such a plasma contains, for example, molecules of sulphur hexafluoride $SF_6$ or hydrogen chloride HCl allowing the silicon material 1 of the false gate to be selectively removed without attacking either the silicon materials 2 and 6, or the spacer 3 and the masking material 5 of silicon nitride. A particle flux from the isotropic etching plasma F2 penetrates the chimney C as far as the volume V. The silicon material 1 of the false gate is thus progressively removed as a peripheral front advancing into the volume V as far as the walls of the latter that are defined by the spacer 3. The residual portion of the silica layer 2 prevents the removal front from reaching the silicon material of the substrate 100 and is for this reason called a stop layer.

The mask M is then removed.

The residual portion of the silica layer 2 is then dissolved by chemical etching by means of the solution based on hydrofluoric acid HF already used for etching the layer 2 in the regions P2. To do this, the solution is introduced via the chimney C, and then removed after a sufficient reaction time in order to completely eliminate the residual portion of the layer 2. This second step of removal of the layer 2 completes the hollowing-out of the volume V after the removal of the temporary material 1. Optionally, the cross section of the chimney C parallel to the surface S is slightly widened during this step, level with the second external material 6, also made of silica. Moreover, the lowering of the upper surface of the material 6 during this step is not significant compared with the total thickness of the material 6.

Next, a coating material 8 (FIG. 9) is introduced into the volume V, obtained from specific precursors supplied via the chimney C. These precursors comprise, for example, gaseous organometallic molecules that react on contact with the exposed walls of the volume V and of the chimney C. Several processes for forming the material 8 may be used, such as chemical vapor deposition (CVD) or atomic layer deposition, these processes being known to those skilled in the art. The coating material 8 thus formed coats the volume V and the chimney C, as well as the upper surface of the external material 6.

The material 8, intended to form electrical insulation between the definitive gate and the substrate 100, may for example be hafnium oxide $HfO_2$. This oxide possesses a particularly high dielectric permittivity coefficient, favorable to reducing the thickness of the coating layer 8, while still providing effective electrical insulation. The hafnium oxide thickness deposited is, for example, between 3 and 5 nanometers.

Finally, the fill material 7 (FIG. 9) is formed in the volume V from suitable precursors introduced via the chimney C. The fill material 7 is formed simultaneously in the volume V and in the chimney C, on the exposed surface of the coating material 8. Several processes may again be used to form the material 8, including chemical vapour deposition, atomic layer deposition or a chemical deposition process known as "electroless" deposition. Such electroless deposition, suitable for a metallic fill material 7, is carried out by introducing a chemical solution into the chimney C. This solution comprises at least one precursor containing an atom of the metal in oxidized form, and added to the solution is an appropriate reducing agent which acts as initiator to liberate the metal atom. As for an example, the chemical vapor deposition and the atomic layer deposition processes are particularly adapted for a material 7 of tungsten, and the electroless process is particularly adapted for a material 7 of nickel or cobalt.

It is also possible to form an initial material 7 in the volume V as described here-above, and then to transform the initial material 7 in situ in order to obtain a final material 7 with specific properties. This transformation may be achieved by heating the transistor after the formation of the initial material 7, or/and by contacting the initial material 7 with at least one fluid chemical compound introduced into the volume V via the chimney C. As for an example, the initial material 7 may be of titanium nitride type, $TiN_x$, x being a stoechiometric number comprised between 0 and 1. x may be then set by chemical reaction of the initial material 7 with a gas comprising nitrogen ($N_2$) and/or hydrogen ($H_2$), or else ammonia ($NH_3$) supplied when the transistor is heated at a temperature high enough, especially higher than 400° C.

The material 7 is chosen to be electrically conducting, preferably a metallic material. That part of the material 7 deposited in the volume V corresponds to the gate of the MOS transistor and that part of the material 7 deposited in the chimney constitutes an electrical connection that connects the gate of the transistor to the upper surface of the external material 6. A thickness of about 50 nanometers of the material 7 deposited provides electrical conduction sufficient to control the electrical voltage on the gate of the final transistor.

Several metallic materials may be selected for the material 7, depending on the electron work function values listed for these materials. It may especially be advantageous to establish symmetry of the trigger voltages of the MOS transistors obtained by the process of the invention, of the n or p type depending on the nature of the gate conduction opposite to the type of doping of the silicon substrate 100 at the source and the drain (portions 101–104 of the substrate 100). Thus, a metal having a work function of around 4 electron-volts, such as aluminium, cadmium, hafnium, indium, magnesium, tantalum, zirconium, a titanium-tungsten alloy, and the like, is particularly suitable for an n-type MOS transistor, that is to say one in which the source and the drain are p-doped. Conversely, for a p-type MOS transistor, that is to say one whose source and drain are n-doped, a metal having a work function of around 5.3 electron-volts is particularly suitable, such as gold, platinum, palladium, ruthenium, rhodium or germanium.

In particular, it is possible to combine on the same substrate MOS transistors of opposite types, produced according to the process of the invention. To do this, the substrate portions constituting the sources and the drains of the transistors of each type are implanted in succession during two implantation steps, of opposite types, by masking, in a manner known to those skilled in the art, the regions of the substrate that are associated with the transistors of the other type. The gates of the transistors of each type are then formed during two successive metalization steps, each using one of the metals of each of the two aforementioned families. A CMOS (complementary MOS) electrical device based on two gate metals (dual metal gate device) is thus obtained.

Figure 9:
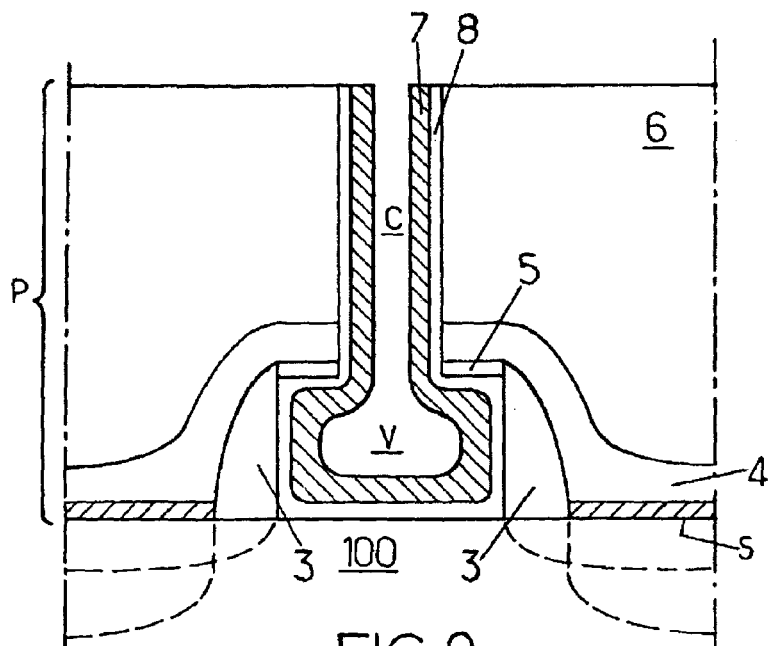

The materials 7 and 8 present on the upper surface of the external material 6 are removed by polishing, so as to obtain the configuration shown in FIG. 9.

Next, two connections are produced through the external materials 4 and 6 so as to establish two electrical contacts with the respective silicide parts 9a of the source and of the drain. To do this, two additional chimneys are formed from the upper surface of the material 6, for example using directional etching similar to that used for the chimney C (see, for comparison, FIG. 7). These two chimneys are in turn filled with conducting material in order to produce electrical connections (see, for comparison, FIG. 9).

In the event of an error in aligning a lithography mask used to define the position of the source and drain chimneys, one of these two chimneys may partly emerge at one end of the volume V, astride the spacer 3. The use of a masking material 5 that is particularly dense and sufficiently resistant to the directional etching process therefore makes it possible to avoid an electrical short circuit between the gate and the source or the drain when filling the source and drain chimneys with the conducting material.

Similarly, an error in aligning the lithography mask used to define the position of the gate chimney C may displace the axis of the latter parallel to the surface S of the substrate 100 so that the chimney C is located astride the spacer 3 and partly emerges in one of the silicide regions 9a. When depositing the fill material 7, an electrical short circuit similar to that mentioned above may still occur.

To avoid such a consequence of incorrect positioning of the gate chimney C, the first external material 4 is chosen so as to have a moderate rate of removal during the directional etching of the chimney C. Because of the inclination of the opposed outer surfaces of the spacer 3 to the volume V, when the spacer 3 is produced in the manner described above, the layer of external material 4 has a greater thickness in the portion P2 of the substrate around the spacer 3. The advance, along the direction D, of the directional etching front of the chimney C is then slowed down in the portion P2 around the spacer 3 over a greater thickness of external material 4 than the thickness of the material 4 above the volume V. Thus a chimney partially offset with respect to the volume V can nevertheless emerge from the volume V without reaching either of the silicide regions 9a. This role of the layer of first external material 4 known as a borderless role, is combined particularly advantageously with the process of the invention in order to obtain transistors of very small dimensions in good yield.

The dimensions of a gate produced in the manner described above are, for example, a width of between 15 and 130 nanometers and a length of between 120 and 200 nanometers, corresponding to the volume V. A projection of such a gate onto the surface S is then a rectangle, that may for example be 25 nanometers by 180 nanometers. FIG. 9 then corresponds to a cross section of such a gate perpendicular to its length. The chimney C may be cylindrical with a circular base, for example having a diameter of 15 nanometers, and may emerge in the gate close to one of its two short sides. Optionally, several chimneys may be simultaneously used for the same gate having the above dimensions, said chimneys being placed for example at regular intervals over the length of this gate. The use of several chimneys for the same gate facilitates in particular the step of removing the temporary material 1 and the steps of introducing and depositing the coating material 8 and the fill material 7 in the volume V.

The process of the invention is also particularly adapted for the production, within a single integrated circuit, of MOS transistors having varied individual characteristics such as, for example, different respective threshold values. Indeed it allows the production of such transistors with a reduced number of steps. The price for manufacturing the circuit comprising these transistors with varied characteristics is then lower than the price of an equivalent circuit produced with known processes.

Different threshold values of a MOS transistor produced according to the invention can be obtained by using two electrically conducting materials for producing the gate of the transistor. The fill material 7 then comprised a first and a second electrically conducting fill materials successively introduced into the volume V, obtained from first respective precursors supplied via the chimney C. The first and second fill materials are deposited in the volume V according to one of the methods described above in relation with the fill material 7. Advantageously, they are deposited in successive chambers of a same tunnel of a plant for manufacturing integrated circuits.

Figure 9A:
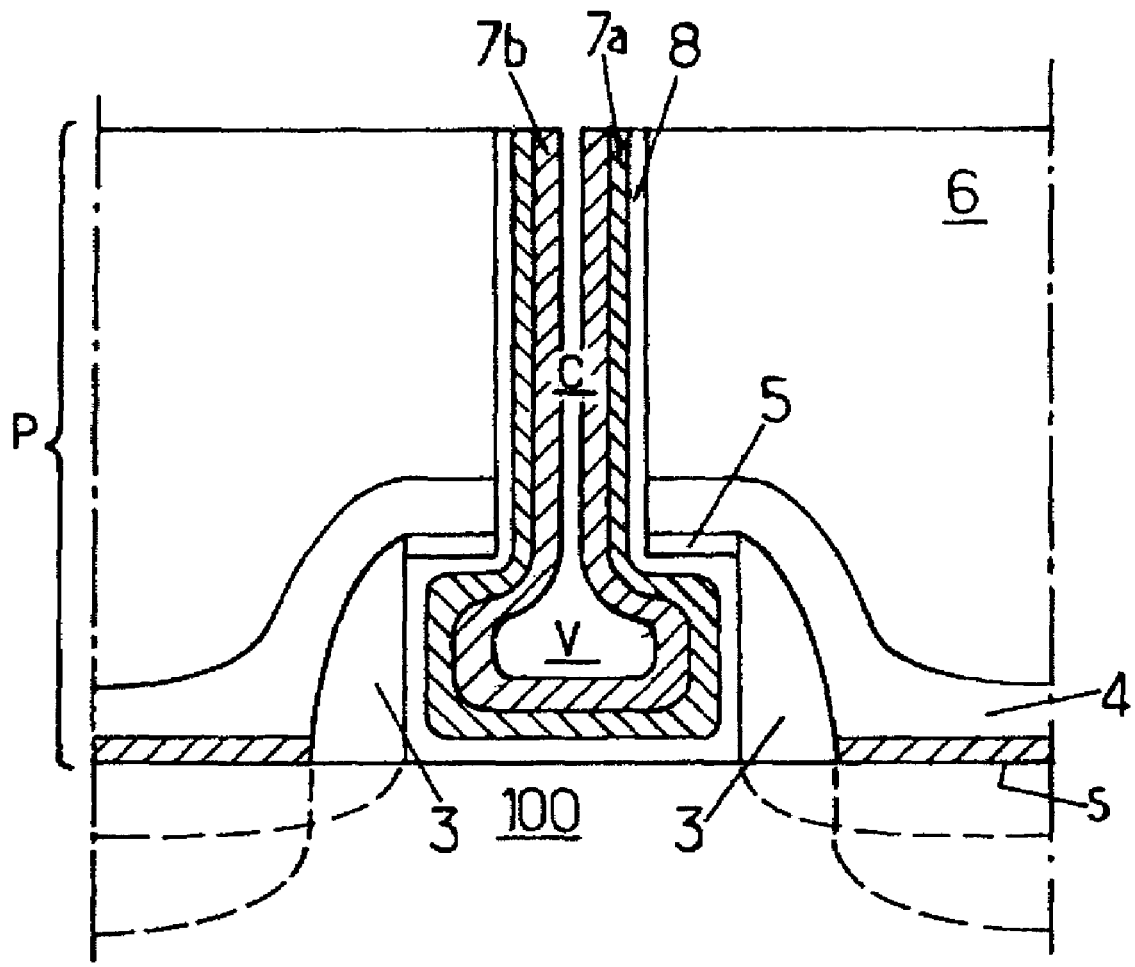
FIG. 9A illustrates a variation in the production of a field-effect transistor using the process of the invention.

FIG. 9A represents a MOS transistor thus obtained. Such transistor is identical to the transistor represented on FIG. 9, except for the gate constitution. This gate is built with two portions of fill materials 7a and 7b. The material 7a is arranged in form of a layer covering the insulating coating layer 8 in the volume V. The material 7b is arranged on the layer of material 7a, in the volume V. Parts of the materials 7a and 7b deposited on the upper surface of the material 6 are then removed according to the method described above in relation with the material 7 and 8.

For example, the material 7a can be polysilicon, and the corresponding layer can have a thickness comprised between 2 and 20 nanometers. The material 7b can be chosen among aluminum, cadmium, hafnium, indium, magnesium, tantalum, zirconium, a titanium-tungsten alloy, gold, platinum, palladium, ruthenium, rhodium, germanium or a compound comprising at least one of these metals. The material 7b can be arranged within the volume V in the form of a layer covering the layer of material 7a, for example with a thickness of about 40 nanometers, or in such a manner to fill the volume V, or else until the chimney C is closed.

Such a constitution of the gate allows to adjust the threshold voltage of the MOS transistor, specially by producing the layer of material 7a with a thin thickness and by choosing the material 7b in a suitable way. When the material 7a is polysilicon, the threshold voltage of the transistor obtained is then intermediate between the threshold voltage of a transistor with a same configuration and with a gate all out of polysilicon, and the threshold voltage of a transistor with a same configuration and with a gate all out of material 7b.

Eventually, the transistor can then be heated so as to induce a chemical reaction between the materials 7a and 7b. A single material resulting from the chemical reaction can then form the gate of the transistor. A gate out of tungsten silicide, nickel silicide or cobalt silicide is thus obtained from a material 7a of silicon and from a material 7b respectively of tungsten, nickel or cobalt.

According to an improvement of the process of the invention, an integrated circuit being produced comprises several MOS transistors, for which the step of introducing the fill material via their respective chimneys has not yet been achieved, for forming their respective gates. These MOS transistors still without gates have respective chimneys with different sections, considered in a plane parallel to the upper surface of the material 6. For example, they can be distributed into a group of transistors with wide chimneys, i.e., with wide sections, and a group of transistors with narrow chimneys, i.e., with little sections. The chimneys of the transistors of both groups can be achieved by a single etching step, by using a mask M formed on top of the material 6 which has an opening for each chimney, corresponding to the section of this latter.

The filling of the respective volumes V of the transistors is then achieved with two steps. During a first step, the first material 7a, for example polysilicon, is introduced into the volumes V, from first precursors supplied via the respective chimneys C of the transistors. The duration of this first step is chosen so that the narrow chimneys C are essentially closed with the material 7a, whereas the wide chimneys C remain essentially open between the access surface and the respective volumes V of the transistors.

During a second step of the filling, the access surface of the circuit is exposed to the first precursors of the material 7b. The material 7b is then formed in the volumes V of the transistors, the respective chimneys of which have remained essentially open after the first step of the filling, i.e., the transistors with wide chimneys. Portions of the material 7b can be deposited during this second step into an upper part of the narrow chimneys, if the closure of the narrow chimneys with the polysilicon during the first filling step is located below the level of the access surface. Such portions are then located in the narrow chimneys distant from the corresponding gates, and they do not influence the electrical behaviour of the transistors thus obtained. So the transistors with narrow chimneys have gates only out of polysilicon, whereas the transistors with wide chimneys have mixed gates out of polysilicon and material 7b. Transistors of both types are thus manufactured in the circuit, differentiated by the dimensions of the sections of their respective chimneys, without any extra masking operations necessary.

As above, the transistor can then eventually be heated, so as to induce a chemical reaction between the materials 7a and 7b in the respective volumes V of the transistors with wide chimneys.

It is then possible to combine such production of MOS transistors with mixed gates with the use of several distinct second fill materials associated with different wide chimneys transistors of a same circuit. To do this, the first filling step is unchanged. A combination of masking operations and depositions of second fill materials is then used for the second filling step, which is identical to the combination described above for associating MOS transistors of opposite types on a same substrate.

The process of the invention can also be used to produce tracks for the rapid transmission of electrical signals. Such tracks are obtained by reducing the capacitive and inductive interactions between the metal parts that constitute the tracks themselves and other materials close to these tracks. In particular, by placing materials having a low dielectric permittivity close to the tracks, it is possible to increase significantly the rate of transmission of the electrical signals carried by the tracks.

The metallic tracks may be produced using the Damascene process or the derived process—dual Damascene—known to those skilled in the art. For the purpose of reducing its ohmic resistance, the metallic material of the tracks is preferably produced at high temperature, for example, at least 400° C., or taken to such a temperature after it has been produced, so as to give it a crystalline structure. On the other hand, materials having a low dielectric permittivity, such as polymers, are degraded by heating to a temperature greater than about 250° C.

The method of producing tracks for rapid transmission of electrical signals described hereafter results from the use of the process of the invention and makes it possible to place a volume of polymer beneath the at least partially crystalline metallic tracks.

According to FIG. 10, a volume V is formed in a substrate 100 by hollowing out a planar surface S of this substrate. The substrate 100 is, for example, made of silicon and the volume V is hollowed out using a method known to those skilled in the art comprising, for example, covering the surface S outside the volume V with a lithography resist mask and exposing the surface S to a dry etching plasma. This etching plasma may contain molecules of sulphur hexafluoride $SF_6$ or hydrogen chloride HCl and is used to obtain rapid directional etching of the silicon of the substrate 100.

A silicon-germanium alloy 1 is then deposited in the volume V so as to completely fill the volume V (FIG. 11). The surface S is then polished in order to remove excess alloy present on the surface S and to obtain a strictly planar final surface S.

A circuit portion P incorporating metallic tracks is then produced on another substrate 200, for example also made of silicon (FIG. 12). This portion P comprises, for example, three superposed silica $SiO_2$ layers 10 within which metallic tracks 11 produced, for example using the Damascene process. The tracks 11 may be made, in particular, of copper or aluminum. The layers 10 and the tracks 11 supported by the substrate 200 are then heated, for example, to a temperature above 400° C., so as to crystalize the metallic material of the tracks. By heating the portion P while it is still supported by the substrate 200, various components (not shown) carried by the substrate 100 and liable to be degraded at high temperature are not subjected to this heating and are thus preserved from any risk of thermal degradation. Such components comprise, for example, regions of the substrate 100 that are implanted with doping elements that could thermally diffuse out of their initial implantation regions.

Preferably, the portion P is covered with a thin layer 10s of silica $SiO_2$ placed on the upper face of the portion P on the opposite side from the substrate 200.

Using the technique called wafer bonding known to those skilled in the art, the portion P is applied via the upper surface S' of the layer 10s, on the opposite side from the substrate 200, to the surface S of the substrate 100 (FIG. 12). In the absence of contamination of the surfaces S and S', chemical bonds are then formed between the exposed materials on the surfaces S and S' brought into contact with each other. These bonds are particularly numerous between the silicon of the substrate 100 and the silicon of the layer 10s. The substrates 100 and 200 are then joined together (FIG. 13). The metallic tracks 11 are initially placed on the substrate 200 so as, after the wafer bonding step, to be above the volume V made in the substrate 100.

The substrate 200 is then removed. This removal comprises, for example, a first phase of mechanically abrading the substrate 200 over almost the entire thickness of the substrate 200, this thickness being considered along the direction D. It then comprises a second, dry etching step so as to remove the residual thickness of silicon of the substrate 200, so as to expose the surface of the portion P on the opposite side from the substrate 100. The configuration shown in FIG. 14 is then obtained.

Figure 15:
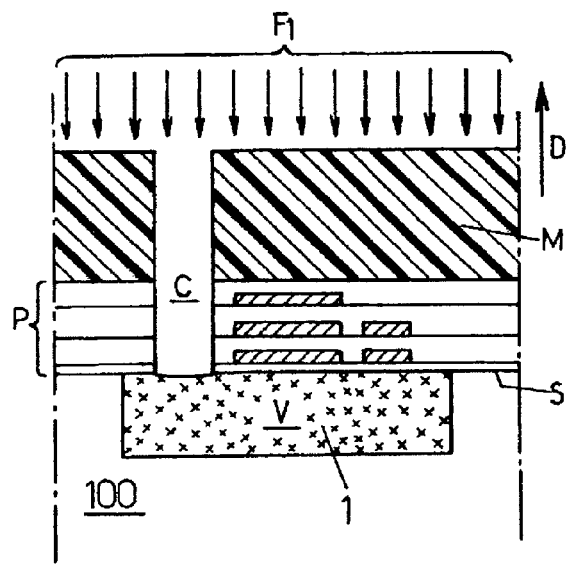

In the same way as in the example for producing an MOS transistor (see, FIGS. 1–9), a chimney C parallel to the direction D is formed through the portion P, from the upper surface of the portion P as far as the volume V. To do this, a flux F1 of directional dry etching particles is sent through a resist mask M deposited on the portion P, with an opening that defines the cross section of the chimney C (FIG. 15). The opening of the mask M is moreover placed in such a way that the chimney C passes through the portion P away from the metallic tracks 11. The directional etching is continued for a specified time so that the chimney C formed reaches the volume V filled with silicon-germanium alloy.

The etching mask M is then removed.

Figure 16:
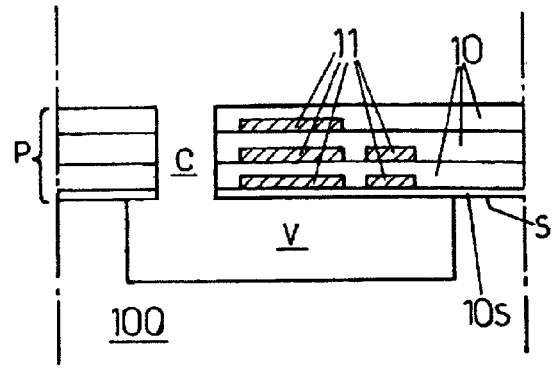

A solution for selectively etching the silicon-germanium alloy is then introduced via the chimney C as far as the volume V. In a manner known to those skilled in the art, an aqueous oxidizing solution composed of 40 milliliters of 70% nitric acid $HNO_3$, 20 milliliters of hydrogen peroxide $H_2O_2$ and 5 milliliters of 5% hydrofluoric acid HF causes the silicon-germanium alloy of the volume V to dissolve without impairing the silicon material of the substrate 100, nor the other materials of the portion P (FIG. 16).

Figure 17:
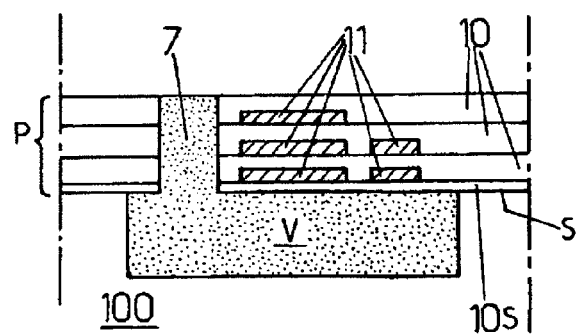

A polymer of low dielectric permittivity is then introduced via the chimney C and deposited in the volume V as fill material 7 (FIG. 17). The polymer may be thermally evaporated, in a known manner, from a solid source of this polymer placed in a crucible heated by resistance heating. Polymer molecules liberated in gaseous form can penetrate the chimney C and the volume V. Optionally, the chimney C may also be filled with polymer during this deposition step. The volume V thus filled extends beneath the metallic tracks 11 and on each side of the projection of the tracks 11 onto the surface S along the direction D. The volume V is then the site only of very slight electrostatic interactions with the tracks 11 when the latter are transmitting electrical signals.

In general, the fill material 7 may be a dielectric of low dielectric permittivity, especially less than 1.40. Apart from a polymer, the fill material 7 may be a compound of the silicon oxicarbide $SiO_xC_y$ type, where x and y are stoichiometric coefficients for oxygen and carbon, respectively, with respect to silicon. The fill material 7 may be carbon having a structure similar to that of diamond (diamond-like carbon) known to those skilled in the art by the acronym DLC.

Two ways of implementing the process of the invention have been described, in the case of the production of MOS transistors and in the production of tracks for the rapid transmission of electrical signals, respectively. These two ways of implementing the process of the invention were taken merely as non-limiting examples, given that the process can be used for the production of a very great variety of integrated electronic components.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A process for producing a gate of a field-effect transistor on a surface of a substantially planar substrate, comprising:
   a) covering the surface of the substrate with a portion defining with the substrate a volume at least partly filled with a temporary material;
   b) removing the temporary material from said volume via a chimney that extends between said volume and an access surface, wherein the chimney has a cross-section, parallel to the surface of the substrate, substantially smaller than a projection of said volume onto the surface of the substrate; and
   c) introducing an electrically conducting fill material into said volume, obtained from first precursors supplied via the chimney, so as to form the gate of the field-effect transistor.

2. The process according to claim 1, wherein at least part of said portion comprises materials formed on the surface of the substrate.

3. The process according to claim 1, comprising the following performed before a) is performed:
   removing part of a material of the substrate corresponding to said volume; and
   at least partly filling said volume with the temporary material.

4. The process according to claim 1, comprising the following performed before a):
   forming a feature on the surface of the substrate comprising said volume at least partly filled with the temporary material.

5. The process according to claim 1, wherein the chimney is formed by removing at least one material external to said volume, between the access surface and said volume.

6. The process according to claim 5, wherein the formation of the chimney comprises a step of etching directionally at least said external material with a plasma.

7. The process according to claim 1, wherein the temporary material comprises a selected one of a silicon, a silicon-germanium alloy, a silica or a silicon nitride.

8. The process according to claim 1, wherein b) comprises isotropically etching the temporary material using one of a plasma or a solution incorporating chemical reactants.

9. The process according to claim 1, wherein said volume is at least partly bounded by at least one material resistant to the removal of the temporary material.

10. The process according to claim 9, wherein the part of the substrate within the volume is exposed by removing a first of the materials resistant to the removal of the temporary material, said volume corresponding to the joining of the space initially occupied at least partly by the temporary material and of the space occupied by at least a portion of said first material resistant to the removal of the temporary material.

11. The process according to claim 9, wherein a second of the materials resistant to the removal of the temporary material surrounds said volume parallel to the surface of the substrate and forms a spacer placed between the gate and a source of said transistor on the one hand, and between the gate and a drain of said transistor on the other.

12. The process according to claim 11, wherein a first external material is formed before b) so as to cover said second material resistant to the removal of the temporary material and at least part of said volume, on an opposite side from the substrate.

13. The process according to claim 1, which furthermore includes a heating of the substrate to be performed before c).

14. The process according to claim 1, wherein during c), the fill material is formed simultaneously in said volume and in the chimney.

15. The process according to claim 14, wherein the chimney at least partly filled with conducting material constitutes an electrical connection connecting the gate of the transistor.

16. The process according to claim 1, which furthermore includes, after c), an in situ transformation of the fill material by heating and/or contacting the fill material with at least a fluid chemical compound introduced into said volume via the chimney.

17. The process according to claim 1, wherein the electrically conducting fill material is selected from the group consisting of polysilicon, titanium nitride, aluminum, cadmium, hafnium, indium, magnesium, tantalum, zirconium, a titanium-tungsten alloy, gold, platinum, palladium, ruthenium, rhodium or germanium.

18. The process according to claim 1, wherein the electrically conducting fill material comprises a first and a second electrically conducting fill materials successively introduced in said volume from precursors supplied via the chimney, so as to form the gate of the field-effect transistor.

19. The process according to claim 18, wherein said first electrically conducting fill material is polysilicon, and wherein said second electrically conducting fill material is selected from the group consisting of aluminum, cadmium, hafnium, indium, magnesium, tantalum, zirconium, a titanium-tungsten alloy, gold, platinum, palladium, ruthenium, rhodium or germanium.

20. The process according to claim 18, which furthermore includes a step of heating the transistor so as to induce a chemical reaction between the first and second electrically conducting fill materials in said volume.

21. The process according to claim 1, wherein c) comprises:
   c1) an introduction of a first electrically conducting fill material into said volume from first precursors of the first fill material supplied via the chimney, so as the chimney is essentially closed or remains essentially open between the access surface and said volume, after the introduction of the first electrically conducting fill material, and
   c2) an exposure of the access surface to first precursors of a second electrically conducting fill material, so as to form the second fill material in said volume if the chimney has remained essentially open after the introduction of the first electrically conducting fill material.

22. The process according to claim 1, which furthermore includes, between b) and c), introducing a coating material into said volume so as to at least cover the exposed part of the substrate, obtained from second precursors supplied via the chimney.

23. The process according to claim 22, wherein the coating material forms an electrical insulation between the electrically conducting fill material forming the gate and the substrate.

24. The process according to claim 22, wherein the coating material comprises a hafnium oxide.

25. The process according to claim 1, wherein the substrate is based on silicon, and wherein a) of the process comprises:
   a1) depositing, on the surface of the substrate, a first material resistant to the removal of the temporary material;
   a2) depositing the temporary material on top of the first material resistant to the removal of the temporary material, on an opposite side from the substrate;
   a3) depositing a masking material on the temporary material, on an opposite side from the substrate;
   a4) removing the masking material and temporary material away from a first region of the substrate;
   a5) removing said first material resistant to the removal of the temporary material, from second regions of the substrate;
   a6) depositing a second material resistant to the removal of the temporary material in at least a third region of the substrate surrounding said first region, the second material resistant to the removal of the temporary material being placed up to a height along a direction perpendicular to the surface of the substrate, of a surface of the masking material on the opposite side from the substrate;
   a7) depositing a metal substantially uniformly in said first, second and third regions;
   a8) heating so as to induce formation of a metal silicide in said second regions, away from said third region;
   a9) removing the residual metal;
   a10) depositing a first external material approximately uniformly in said first and third regions, and in a fourth region of the substrate surrounding said third region.

26. The process according to claim 25, wherein a) further includes:

a11) covering the first external material with a second external material.

27. The process according to claim 25, wherein the first material resistant to the removal of the temporary material is based on silica, and wherein the second material resistant to the removal of the temporary material and the first external material are based on silicon nitride.

28. The process according to claim 25, wherein the masking material is selected from the group consisting of silica or silicon nitride.

29. A method for producing a field effect transistor, comprising:
 forming a false gate surrounded by material over a substrate;
 excavating a chimney in the surrounding material to reach the false gate, the chimney having a cross-section, parallel to the surface of the substrate, smaller than a projection of said false gate onto the surface of the substrate;
 removing the false gate through the excavated chimney to form a false gate region; and
 filling the chimney and false gate region with an electrically conductive material to define a transistor gate.

30. The method of claim 29 further including defining source and drain regions in the substrate adjacent the area of where the false gate is formed.

31. The method of claim 30 further including excavating a chimney in the surrounding material to reach the source region and excavating a chimney in the surrounding material to reach the drain region.

32. The method of claim 31 further including siliciding the source and drain regions to form metal contacts.

33. The method of claim 32 further including filling the chimneys for the source and drain regions with an electrically conductive material to connect with the silicide metal contacts.

34. The method of claim 29 wherein forming includes defining the false gate and surrounding the false gate with protective materials.

35. The method of claim 29 wherein the electrically conductive material which fills the chimney comprises a polysilicon material.

36. The method of claim 29 wherein the electrically conductive material which fills the chimney comprises a metal.

37. The method of claim 29 wherein the electrically conductive material which fills the chimney comprises combination of a metal and polysilicon.

38. The method of claim 37 further including forming a silicide from the combination of metal and polysilicon which fills the chimney.

39. The field effect transistor formed by the process of claim 29.

40. A method for producing conductive tracks, comprising:
 forming a volume in a first substrate;
 filling the volume with a first material;
 forming a circuit portion with conductive tracks on a second substrate;
 flipping the second substrate upside-down and bonding an upper surface of the circuit portion to an upper surface of the first substrate such that the conductive tracks overlie the first material filled volume;
 removing the second substrate to leave the circuit portion bonded to the first substrate;
 excavating a chimney in the circuit portion to reach the first material filled volume;
 removing the first material through the excavated chimney to form a volume region; and
 filling the chimney and the volume region with a second material.

41. The method of claim 40 wherein the second material is a low dielectric material.

42. An integrated circuit including conductive tracks formed by the process of claim 40.

43. A method for integrated circuit production, comprising:
 defining a surrounded sacrificial region filled with a first material, wherein the surrounded sacrificial region is a trench formed in a substrate;
 excavating a chimney in a second material surrounding the sacrificial region to reach that sacrificial region, wherein the second material surrounding the sacrificial region comprises the substrate and an overlying circuit portion;
 removing the first material through the excavated chimney to form a volume region; and
 filling the chimney and the volume region with a third material.

44. The method of claim 43 wherein the chimney is excavated through the overlying circuit portion to reach the sacrificial region.

45. The method of claim 43 wherein the overlying circuit portion includes conductive tracks which overlie the sacrificial region.

46. The method of claim 45 wherein the third material is a low dielectric material electrostatically insulating the conductive tracks from the substrate.

47. The method of claim 43 wherein the surrounded sacrificial region is a false gate region formed above a substrate and the second material surrounding the sacrificial region comprises the protective material for the false gate region.

48. The method of claim 47 wherein the chimney is excavated through the protective material to reach the false gate region.

49. The method of claim 47 wherein the third material is a conductive material forming a transistor gate and gate contact.

50. The method of claim 49 wherein the conductive material which fills the chimney comprises a polysilicon material.

51. The method of claim 49 wherein the conductive material which fills the chimney comprises a metal.

52. The method of claim 49 wherein the conductive material which fills the chimney comprises combination of a metal and polysilicon.

53. The method of claim 52 further including forming a silicide from the combination of metal and polysilicon which fills the chimney.

54. An integrated circuit formed by the process of claim 43.

55. The integrated circuit of claim 54 wherein the process of claim 43 is used to fabricate a field effect transistor.

56. The integrated circuit of claim 54 wherein the process of claim 43 is used to fabricated conductive tracks.

* * * * *